United States Patent [19]
Calkins

[11] Patent Number: 5,111,203
[45] Date of Patent: May 5, 1992

[54] CIRCUITRY FOR CONDITIONING ANALOG SIGNALS AND CONVERTING TO DIGITAL FORM

[75] Inventor: Robert A. Calkins, Wrentham, Mass.

[73] Assignee: Data Translation, Inc., Marlboro, Mass.

[21] Appl. No.: 618,722

[22] Filed: Nov. 27, 1990

[51] Int. Cl.$^5$ .......................................... H03M 1/06
[52] U.S. Cl. .................................... 341/141; 341/118
[58] Field of Search ............... 341/118, 120, 139, 141

[56] References Cited

U.S. PATENT DOCUMENTS

| | | | |
|---|---|---|---|
| 3,961,325 | 6/1976 | Kendall et al. | 341/120 |
| 4,016,557 | 4/1977 | Zitelli et al. | 341/139 |
| 4,143,361 | 3/1979 | Tammes et al. | 341/118 |
| 4,321,583 | 3/1982 | Baron et al. | 341/118 |
| 4,410,880 | 10/1983 | Zaborowski | 341/154 |
| 4,423,408 | 12/1983 | Place | 341/166 |
| 4,454,500 | 6/1984 | Kato et al. | 341/141 |
| 4,677,422 | 6/1987 | Naito | 341/122 |
| 4,890,095 | 12/1989 | Esser et al. | 340/657 |
| 4,908,621 | 3/1990 | Polonio et al. | 341/120 |
| 4,937,575 | 6/1990 | Kummer | 341/118 |
| 4,962,380 | 10/1980 | Meadows | 341/120 |

*Primary Examiner*—A. D. Pellinen
*Assistant Examiner*—Marc S. Hoff
*Attorney, Agent, or Firm*—Fish & Richardson

[57] ABSTRACT

A circuit for converting input analog signals to output digital signals including an analog-to-digital converter having an analog input, an offset input and a digital output that represents the value of a signal at the analog input offset by an amount related to the value of the signal at the offset input, signal conditioning circuitry for receiving the input analog signal and providing it to the analog input via one of a plurality of different paths or under one of a plurality of different conditions, the different paths or different conditions providing different offsets to the input analog signal, and an offset correction memory storing offset correction characteristics for respective paths or conditions and being connected to provide an offset signal based on the characteristic for a path or condition to the offset input.

19 Claims, 1 Drawing Sheet

CIRCUITRY FOR CONDITIONING ANALOG SIGNALS AND CONVERTING TO DIGITAL FORM

BACKGROUND OF THE INVENTION

The invention relates to circuits including analog-to-digital converters, and in particular to data acquisition circuits including an analog-to-digital converter and circuitry for receiving a plurality of input analog signals and conditioning one of the signals before presenting it to the analog-to-digital converter.

Analog-to-digital converters have been used in data acquisition circuits to convert analog input signals into digital signals that can then be used by digital processing circuitry, such as computers. Such data acquisition circuits have used amplifiers and range selection circuits in circuitry that conditions the analog input signal prior to being presented to the analog-to-digital converter.

SUMMARY OF THE INVENTION

The invention features, in general, circuitry including an analog-to-digital converter and signal conditioning circuitry that receives an input analog signal and provides it to the analog-to-digital converter via one of a plurality of different paths (e.g., different input channels) or under one of a plurality of different conditions (e.g., different amplifier gains or different ranges), the different paths or different conditions resulting in different offsets to the input to the analog-to-digital converter. An offset correction memory is used to store offset correction characteristics based upon the offsets for respective paths or conditions. Depending upon which path or condition is employed in providing the input signal through the conditioning circuitry to the analog-to-digital converter, the appropriate offset characteristic is used to generate an offset signal to correct the output digital signal of the analog-to-digital converter. This thus provides calibration for all possible paths or conditions in the signal conditioning circuitry.

In preferred embodiments, the signal conditioning circuitry includes a plurality of input channels, and there is a filter on each channel and a multiplexer that is connected to receive the outputs of the filters and to select one filter's output as the signal provided to the analog-to-digital converter. The signal conditioning circuitry also includes an amplifier with different gain values and a bipolar range or unipolar range selection circuit. The offset correction memory stores a separate correction characteristic (i.e., value) for each possible combination of input channel, amplifier gain value, and bipolar or unipolar range. The same digital selection signals used to select the input channel at the multiplexer, the gain at the amplifier, and the range at the range selection circuit are used to address the offset correction memory. A digital-to-analog converter receives the digital output read from the offset correction memory and provides an analog offset correction signal to an offset input of an offset correction circuit included in the analog-to-digital converter. An up/down counter is connected to provide a digital output to both the digital-to-analog converter and to the offset correction memory. In a calibration mode, the inputs to the filters are grounded, and, for each of the possible combinations of input channel, gain and range, the up/down counter is adjusted until the digital-to-analog converter provides an offset signal that causes the output of the analog to digital converter to be at the expected value; when this occurs, the multibit digital signal being provided by the up/down counter is read into the memory at an address corresponding to the combination of conditions.

Other advantages and features of the invention will be apparent from the following description of a preferred embodiment thereof and from the claims.

DESCRIPTION OF THE PREFERRED EMBODIMENT

Figure 1:
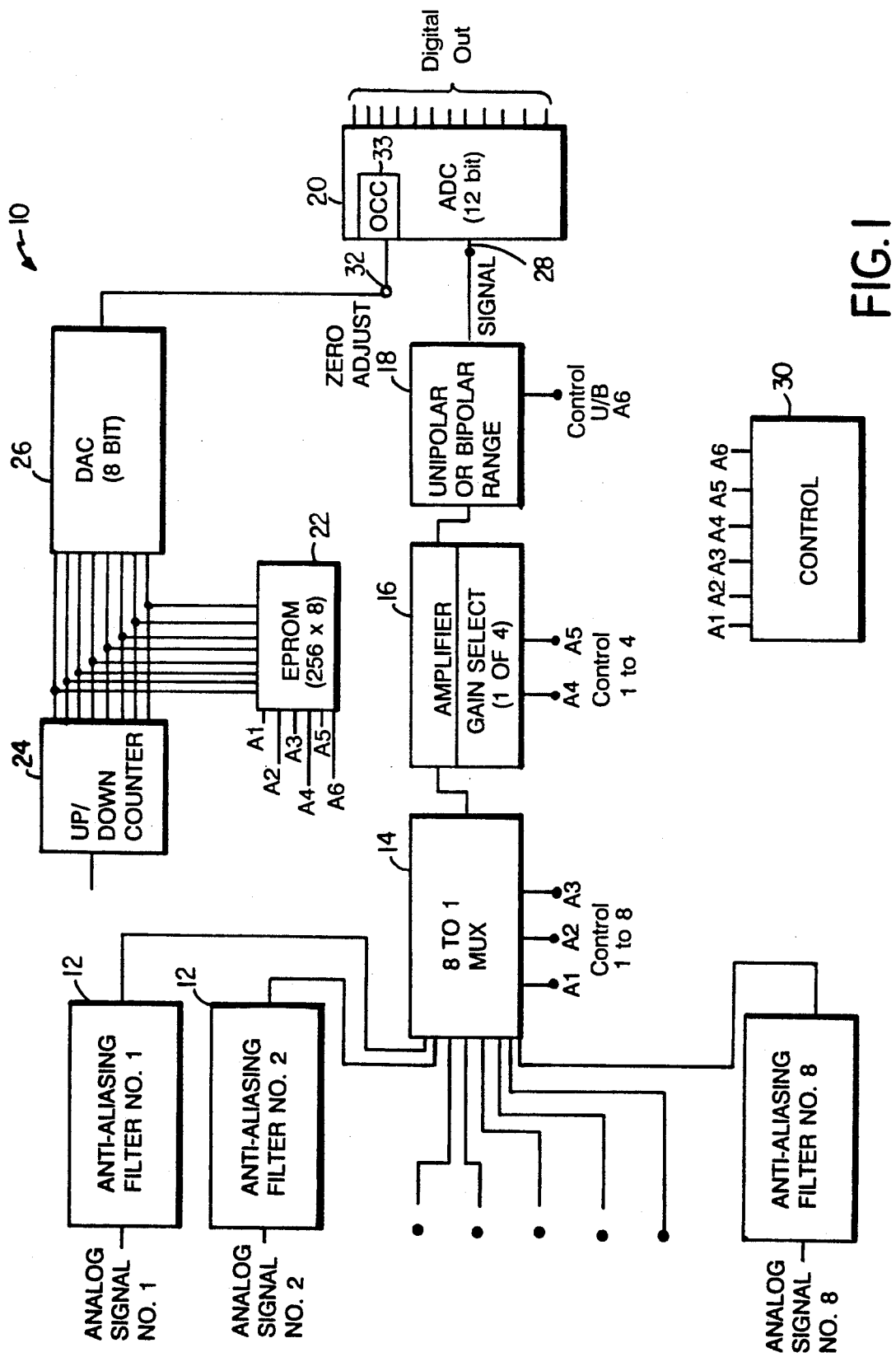

The preferred embodiment will now be described.

DRAWING

FIG. 1 is block diagram of a data acquisition circuit for converting one of a plurality of analog input signals into a digital output signal.

STRUCTURE

Referring to the FIGURE, there is shown data acquisition circuit 10 including eight anti-aliasing filters 12, 8:1 multiplexer 14, amplifier 16, unipolar or bipolar range selection circuit 18, analog-to-digital converter (ADC) 20, offset correction memory 22, up/down counter 24 and digital-to-analog converter (DAC) 26. Components 12–18 make up signal conditioning circuitry that receives eight input analog signals and provides one signal to analog input 28 of ADC 20.

Filters 12 are differential input, fourth-order, antialiasing filters based on an active four-pole Butterworth configuration. The filters provide a flat response in the passband and good attenuation in the stopband. The eight filters provide different offsets (i.e., offset voltages) to the analog signals passing through them. Multiplexer 14 receives three-bit digital selection signal A1, A2, A3 to select the output of one of the eight antialiasing filters 12 to provide as its output to amplifier 16. Amplifier 16 provides programmable gains of 1, 2, 4 and 8, depending upon two-bit digital selection signal A4, A5. The output of amplifier 16 has an offset associated with it that depends upon which of the four gain values has been selected. Unipolar or bipolar range selection circuit 18 adjusts the range and gain of the input signal so that the full range of the input signal is provided over the full range of ADC 20. ADC 20 is a bipolar ADC with a range of $-10$ V to $+10$ V; when a unipolar input signal range of 0 to $+10$ V is used, circuit 18 provides a gain of two and shifts the input signal by $-10$ V. The offset caused by range selection circuit 18 depends upon whether the unipolar or bipolar range has been selected by digital selection signal A6. Control circuitry 30 provides digital selection signals A1 through A6 to multiplexer 14, amplifier 16 and range selection circuit 18. Digital selection signals A1 to A6 are also provided to address offset correction memory 22, which is a 256 by 8 electrically erasable programmable read only memory (EEPROM). The eight-bit, parallel, digital output of offset correction memory 22 is connected to the input of DAC 26. Up/down counter 24 has an eight-bit output that is connected to the eight data lines of offset correction memory 22 and the input of DAC 26. DAC 26 outputs an analog offset signal (voltage) provided to the zero adjust input of offset correction circuit 33 included in ADC 20. ADC 20 has a 12-bit output. Control logic 30 provides selection signals A1 to A6 and other control signals to operate the components of data acquisition circuit 10 under control of an external computer (not shown).

OPERATION

Circuitry 10 operates in either the calibration mode or the operation mode.

In the calibration mode, the digital numbers stored in offset correction memory 22 are obtained by grounding the inputs to filters 12, and, for each of the 64 possible combinations of values for selection signals A1 to A6, up/down counter 24 is adjusted until DAC 26 provides an offset signal that causes the output of ADC 20 to be the expected number. When this happens, the digital output of counter 24 is read into memory 22 at the address corresponding to the combination of selection signals. In making an increment or decrement decision for counter 24, a plurality of measurements are made by ADC 20 and averaged. The result of the averaging is used as the basis for the increment or decrement decision. When the averaged value differs greatly from the expected value, counter 24 is incremented or decremented by a larger value than when the difference in values is much smaller so as to reduce the time to achieve convergence to a value close to the expected value, based upon the resolution provided by eight-bit DAC 26.

In operation, selection signal A1, A2, A3 is used to select the analog input signal to be provided to ADC 20; selection signal A4, A5 is used to select the gain provided at amplifier 16, and selection signal A6 is used to select either the unipolar or the bipolar range. The same control signals are used to address the correction characteristics stored in offset correction memory 22 for the particular combination of input channel, gain and range. The digital numbers stored in memory 22 are used to provide the proper offset correction (voltage) to the zero adjust input 32 of ADC 20.

Other Embodiments

Other embodiments of the invention are within the scope of the following claims. For example, if there are other conditions that might affect the offset in the analog signal provided to ADC 20, additional address bits can be provided for memory 22. For example, if filters 12 each had programmable cut-off frequencies that caused different offsets, the digital control signals to select the frequencies can be used to provide an additional bit to memory 22, and the calibration procedure would include the additional combinations resulting from the added conditions.

What is claimed is:

1. A circuit for converting an input analog signal or signals into an output digital signal comprising
   an analog-to-digital converting circuit having an analog input and a digital output that provides said output digital signal, said output digital signal representing the value of an analog signal at said analog input,
   signal conditioning circuitry for receiving a said input analog signal and selectably providing it to said analog input via one of a plurality of different paths or under one of a plurality of different conditions, said different paths or different conditions resulting in different offsets being imposed upon said input analog signal, said signal conditioning circuitry being connected to select a said path or a said condition based upon a digital selection signal,
   an offset correction memory storing offset correction characteristics for respective said paths or respective said conditions and providing an offset signal based on a said characteristic for a path or condition, said memory being connected to be addressed by said digital selection signal, and
   an offset correction circuit that has an offset input that receives said offset signal from said offset correction memory and causes the value of said output digital signal to be adjusted by an amount related to the magnitude of said offset signal, to thereby correct said output digital signal for the offset related to the respective path or condition.

2. The circuit of claim 1 wherein said analog-to-digital converting circuit and said offset correction circuit are included within an analog-to-digital converter component that has said analog input, said digital output, and said offset input.

3. The circuit of claim 1 wherein said signal conditioning circuitry includes a plurality of different input channels for receiving respective input analog signals, each input channel providing a said different path.

4. The circuit of claim 1 wherein said signal conditioning circuitry includes an amplifier that selectably provides different gain values, and wherein each said gain value provides a said different condition.

5. The circuit of claim 1 wherein said offset correction memory provides said offset signal in digital form, and further comprising a digital-to-analog converter connected to receive said offset signal in digital form and convert it to analog form and provide said offset signal in analog form to said offset correction circuit.

6. A circuit for converting an input analog signal or signals into an output digital signal comprising
   an analog-to-digital converting circuit having an analog input and a digital output that provides said output digital signal, said output digital signal representing the value of an analog signal at said analog input,
   signal conditioning circuitry for receiving a said input analog signal and selectably providing it to said analog input via one of a plurality of different paths or under one of a plurality of different conditions, said different paths or different conditions resulting in different offsets being imposed upon said input analog signal, said signal conditioning circuitry being connected to select a said path or a said condition based upon a digital selection signal,
   an offset correction memory storing offset correction characteristics for respective said paths or respective said conditions and providing an offset signal based on a said characteristic for a path or condition, said memory being connected to be addressed by said digital selection signal, and
   an offset correction circuit that has an offset input that receives said offset signal from said offset correction memory and causes the value of said output digital signal to be adjusted by an amount related to the magnitude of said offset signal, to thereby correct said output digital signal for the offset related to the respective path or condition,
   wherein said signal conditioning circuitry includes a plurality of different input channels for receiving respective input analog signals, each input channel providing a said different path,
   wherein said signal conditioning circuitry is connected to select a said input channel based upon a digital selection signal, and wherein said memory is connected to be addressed by said digital selection signal.

7. The circuit of claim 6 wherein said digital selection signal is a multibit, parallel signal.

8. The circuit of claim 6 wherein said circuit includes a filter on each said input channel and a multiplexer connected to receive the outputs of said filters and said digital selection signal and select one filter's output as its output to said analog-to-digital converter based upon said digital selection signal.

9. The circuit of claim 8 wherein said signal conditioning circuitry includes an amplifier that selectably provides different gain values, wherein each said gain value provides a said different condition, wherein said signal conditioning circuitry is connected to select a said gain value based upon a digital selection signal provided to said amplifier, and wherein said memory is connected to be addressed by said digital selection signals provided to said multiplexer and said amplifier.

10. The circuit of claim 9 wherein said signal conditioning circuitry includes a bipolar range or unipolar range selection circuit, wherein said bipolar range and said unipolar range have different said conditions, wherein said signal conditioning circuitry is connected to select a said range based upon a digital selection signal, and wherein said memory is connected to be addressed by said digital selection signals provided to said multiplexer, said amplifier, and said range selection circuit.

11. The circuit of claim 10 wherein said offset correction memory provides said offset signal in digital form, and further comprising a digital-to-analog converter connected to receive said offset signal in digital form and convert it to analog form and provide said offset signal in analog form to said offset correction circuit.

12. The circuit of claim 11 further comprising an up/down counter connected to provide a digital output to said digital-to-analog converter and to said offset correction memory.

13. A circuit for converting an input analog signal or signals into an output digital signal comprising an analog-to-digital converting circuit having an analog input and a digital output that provides said output digital signal, said output digital signal representing the value of an analog signal at said analog input, signal conditioning circuitry for receiving a said input analog signal and selectably providing it to said analog input via one of a plurality of different paths or under one of a plurality of different conditions, said different paths or different conditions resulting in different offsets being imposed upon said input analog signal, said signal conditioning circuitry being connected to select a said path or a said condition based upon a digital selection signal, an offset correction memory storing offset correction characteristics for respective said paths or respective said conditions and providing an offset signal based on a said characteristic for a path or condition, said memory being connected to be addressed by said digital selection signal, and an offset correction circuit that has an offset input that receives said offset signal from said offset correction memory and causes the value of said output digital signal to be adjusted by an amount related to the magnitude of said offset signal, to thereby correct said output digital signal for the offset related to the respective path or condition, wherein said signal conditioning circuitry includes a bipolar range or unipolar range selection circuit, and wherein said bipolar range and said unipolar range have different said conditions.

14. The circuit of claim 13 wherein said signal conditioning circuitry is connected to select a said range based upon a digital selection signal, and wherein said memory is connected to be addressed by said digital selection signal.

15. A circuit for converting an input analog signal or signals into an output digital signal comprising an analog-to-digital converting circuit having an analog input and a digital output that provides said output digital signal, said output digital signal representing the value of an analog signal at said analog input, signal conditioning circuitry for receiving a said input analog signal and selectably providing it to said analog input via one of a plurality of different paths or under one of a plurality of different conditions, said different paths or different conditions resulting in different offsets being imposed upon said input analog signal, said signal conditioning circuitry being connected to select a said path or a said condition based upon a digital selection signal, an offset correction memory storing offset correction characteristics for respective said paths or respective said conditions and providing an offset signal based on a said characteristic for a path or condition, said memory being connected to be addressed by said digital selection signal, and an offset correction circuit that has an offset input that receives said offset signal from said offset correction memory and causes the value of said output digital signal to be adjusted by an amount related to the magnitude of said offset signal, to thereby correct said output digital signal for the offset related to the respective path or condition, wherein said signal conditioning circuitry includes an amplifier that selectably provides different gain values, and wherein each said gain value provides a said different condition, wherein said signal conditioning circuitry is connected to select a said gain value based upon a digital selection signal provided to said amplifier, and wherein said memory is connected to be addressed by said digital selection signal.

16. A circuit for converting an input analog signal or signals into an output digital signal comprising an analog-to-digital converting circuit having an analog input and a digital output that provides said output digital signal, said output digital signal representing the value of an analog signal at said analog input, signal conditioning circuitry for receiving a said input analog signal and selectably providing it to said analog input via one of a plurality of different paths or under one of a plurality of different conditions, said different paths or different conditions resulting in different offsets being imposed upon said input analog signal, said signal conditioning circuitry being connected to select a said path or a said condition based upon a digital selection signal, an offset correction memory storing offset correction characteristics for respective said paths or respective said conditions and providing an offset signal based on a said characteristic for a path or condition, said memory being connected to be addressed by said digital selection signal, and an offset correction circuit that has an offset input that receives said offset signal from said offset correction memory and causes the value of said output digital signal to be adjusted by an amount related to the magnitude of said offset signal, to thereby correct said output digital signal for the offset related to the respective path or condition, wherein said offset correction memory provides said offset signal in digital form, and further comprising a digital-to-analog converter connected to receive said offset signal in digital form and convert it to analog form and provide said offset signal in analog form to said offset correction circuit, further comprising an up/down counter connected to provide a digital output to said digital-to-analog converter and to said offset correction memory.

17. The circuit of claim 16 wherein said filters are antialiasing filters.

18. A circuit for converting an input analog signal or signals into an output digital signal comprising an analog-to-digital converting circuit having an analog input and a digital output that provides said output digital signal, said output digital signal representing the value of an analog signal at said analog input, signal conditioning circuitry for receiving a said input analog signal and providing it to said analog input via one of a plurality of different paths or under one of a plurality of different conditions, said different paths or different conditions resulting in different offsets being imposed upon said input analog signal, an offset correction memory storing offset correction characteristics for respective said paths or respective said conditions and providing an offset signal based on a said characteristic for a path or condition, an offset correction circuit that has an offset input that receives said offset signal from said offset correction memory and causes the value of said output digital signal to be adjusted by an amount related to the magnitude of said offset signal, to thereby correct said output digital signal for the offset related to the respective path or condition, and offset characteristic generating means for generating an offset correction characteristic and providing it to said offset correction circuit and to said memory and for changing said offset correction characteristic in response to the resulting said digital output signal from said analog-to-digital converting circuit.

19. The circuit of claim 18 wherein said offset correction memory provides said offset signal in digital form, and further comprising a digital-to-analog converter connected to receive said offset signal in digital form and convert it to analog form and provide said offset signal in analog form to said offset correction circuit, and wherein said offset characteristic generating means comprises an up/down counter connected to provide a digital output to said digital-to-analog converter and to said offset correction memory.

* * * * *